(12) United States Patent
Park

(10) Patent No.: US 6,927,114 B2
(45) Date of Patent: Aug. 9, 2005

(54) METHOD FOR FABRICATING A HIGH VOLTAGE DUAL GATE DEVICE

(75) Inventor: Seong-hee Park, Chungcheongbuk-do (KR)

(73) Assignee: Hynix Semiconductor Inc., Gyunggi-do (KR)

( * ) Notice: Subject to any disclaimer, the term of this patent is extended or adjusted under 35 U.S.C. 154(b) by 0 days.

(21) Appl. No.: 10/785,493

(22) Filed: Feb. 24, 2004

(65) Prior Publication Data

US 2004/0171197 A1 Sep. 2, 2004

(30) Foreign Application Priority Data

Feb. 27, 2003 (KR) ................................. 10-2003-0012403

(51) Int. Cl.[7] .......................................... H01L 21/8238
(52) U.S. Cl. ..................................... 438/200; 438/224
(58) Field of Search ................................. 438/200, 220, 438/224, 228, 275, 296

(56) References Cited

U.S. PATENT DOCUMENTS

| | | | |
|---|---|---|---|
| 4,978,628 A | * 12/1990 | Rosenthal | .................... 438/220 |
| 5,369,052 A | * 11/1994 | Kenkare et al. | ............ 438/439 |
| 5,861,347 A | 1/1999 | Maiti et al. | |
| 6,249,030 B1 | 6/2001 | Lee | |
| 6,281,077 B1 | * 8/2001 | Patelmo et al. | ............. 438/258 |
| 6,392,275 B1 | 5/2002 | Jang | |
| 6,399,448 B1 | 6/2002 | Mukhopadhyay et al. | |
| 6,468,099 B2 | 10/2002 | Kim | |
| 6,566,207 B2 | 5/2003 | Park | |

* cited by examiner

Primary Examiner—Chandra Chaudhari
(74) Attorney, Agent, or Firm—Marshall, Gerstein & Borun LLP

(57) ABSTRACT

A method for fabricating a high voltage dual gate device is disclosed which limits damage to a device isolation layer by forming a high voltage oxide film after formation of a buffer nitride film. The method includes forming high voltage n-type and p-type well regions in a high voltage device forming region of a semiconductor substrate having a low voltage device forming region and the high voltage device forming region; forming the source/drain of a high voltage NMOS transistor and the source/drain of a high voltage PMOS transistor in the well regions; forming a device isolation layer in a device isolation layer by a STI process and forming a buffer nitride film on the entire surface; forming a high voltage gate oxide film on the buffer nitride film and leaving the same intact on top of the high voltage device forming region while etching the high voltage gate oxide film and buffer nitride film disposed on the low voltage device forming region; and forming low voltage p-type and n-type well regions in the low voltage device forming region and forming a low voltage gate oxide film on the surfaces.

20 Claims, 8 Drawing Sheets

METHOD FOR FABRICATING A HIGH VOLTAGE DUAL GATE DEVICE

TECHNICAL FIELD

Methods for fabricating high voltage dual gate semiconductor devices are disclosed which can suppress damage to the device isolation layer during the fabrication by forming a high voltage oxide film after an etching process is carried out on an overlying nitride film.

DESCRIPTION OF THE RELATED ART

Power device products such as LDI products (liquid crystal display (LCD) driver (D) integrated circuit (IC)) require both low voltage (LV) operation for driving a logic circuit and high voltage (HV) operation for driving the LCD device. Accordingly, associated gate oxide films should be made of the dual gate type. Moreover, it is inevitable that a trench isolation (TI) process be equipped with the trend of a finer line width for improved miniaturization.

However, if a dual gate oxide fabrication process forms a shallow trench isolation (STI) structure formed as a result of the TI process, excessive numbers of STI recesses occur in the low voltage (LV) region during the formation of a dual gate oxide film for HV region, thereby adversely affecting the operating characteristics of the device.

Figure 1:
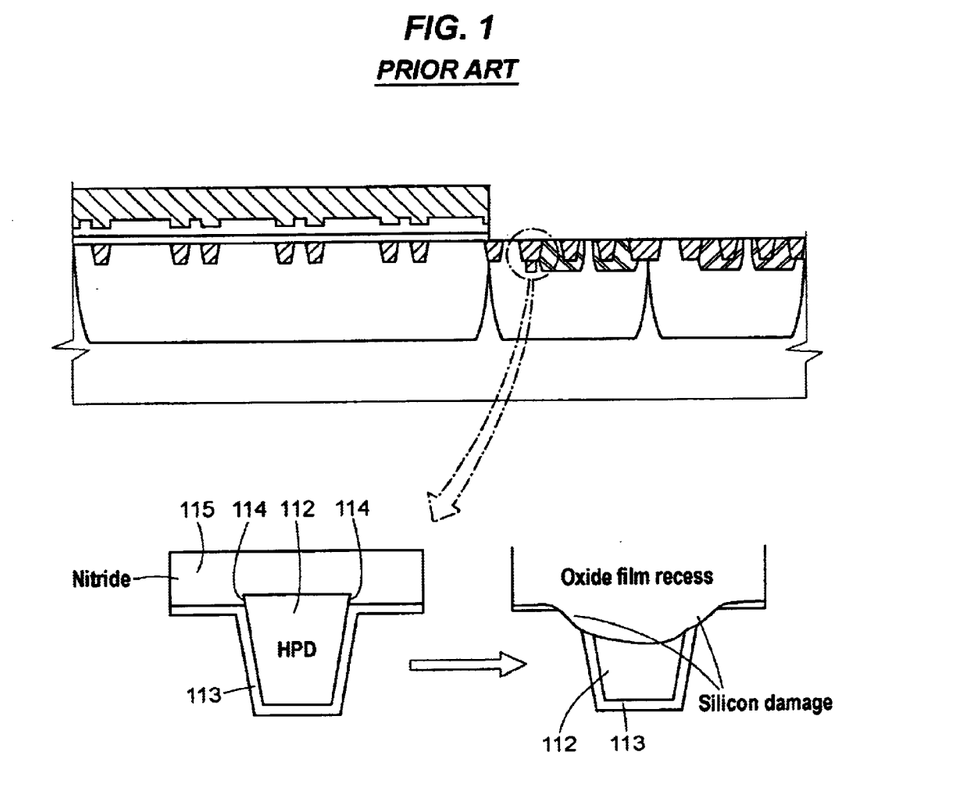
FIG. 1 is a sectional view of the structure of a prior art high voltage dual gate device.

The reason for this phenomena is as follows. As shown in FIG. 1, using chemical vapor deposition (CVD) or high density plasma (HDP) techniques, an oxide coating material 112 is deposited and used for a gap fill of the STI structure. The gap fill material 112 may be undoped silica glass (USG) or HDP oxide. A thermal oxide film coating material 113 is used as the gate oxide film. Thus, upon forming dual oxide films 113, 112, a rather severe dent 114 is generated between an active region and a field region due to the difference in wet etching rate between the thermal oxide film 113 and the gap fill oxide film as HDP oxide film 112.

As shown in FIG. 1, a HV nitride etching is not sufficient to completely remove all the nitride material 115 on an active region using a dry etching process due to the difference in thickness between the nitride 115 on the HV active region and the nitride 115 on the STI or on top of the oxide gap fill shown at 112.

This leads to the damage of the HDP oxide film 112 in the STI and the influence on the silicon of a trench corner due to the etching selectivity.

Further, when removing the nitride layer 115 by wet etching, since the etching selection ratio of the nitride 115 and HDP oxide 112 is about 1, a recess or erosion of the oxide film 112 occurs as shown in FIG. 1 and the logic region is lost.

Thus, the prior art high voltage dual gate device has the following problems.

Upon etching the nitride film 115 in a high voltage device region, the HDP oxide film 112 in the STI is partially eroded and the silicon of the trench corner is damaged as shown in FIG. 1 by the etching selectivity due to a difference in thickness of the nitride 115 in the active region and the nitride over the STI as shown in FIG. 1.

Moreover, upon removing the nitride 115 by wet etching, a recess of the field oxide film 112 (and gate oxide film 113) occurs and the logic region is lost.

SUMMARY OF THE DISCLOSURE

A method for fabricating a high voltage dual gate device is disclosed which can suppress the damage of a device isolation layer by forming a high voltage oxide film after an optional etching process is carried out on the nitride film.

A disclosed method for fabricating a high voltage dual gate device comprises: forming high voltage n-type and p-type well regions in a high voltage device forming region of a semiconductor substrate having a low voltage device forming region and the high voltage device forming region; forming the source/drain of a high voltage NMOS transistor and the source/drain of a high voltage PMOS transistor in the well regions; forming a device isolation layer in a device isolation layer by a STI process and forming a buffer nitride film on the entire surface; forming a high voltage gate oxide film on the buffer nitride film and leaving the same only in the high voltage device forming region; and forming low voltage p-type and n-type well regions in the low voltage device forming region and forming a low voltage gate oxide film on the surfaces.

BRIEF DESCRIPTION OF THE DRAWINGS

Other aspects of the disclosed techniques will become apparent from the following description of the preferred embodiments with reference to the accompanying drawings wherein.

DETAILED DESCRIPTION OF THE PRESENTLY PREFERRED EMBODIMENTS

Hereinafter, a preferred embodiment and variations thereof will be described in more detail referring to the drawings.

Figure 2A:
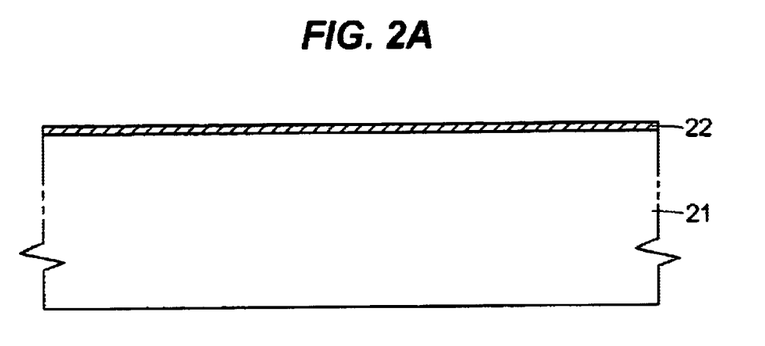
FIGS. 2a to 2p are sectional views showing disclosed processes for fabricating a high voltage dual gate device.
Figure 2B:
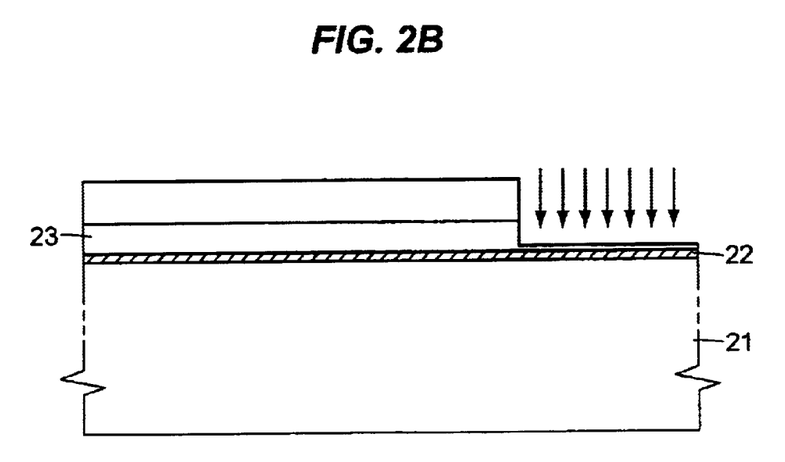
Figure 2C:
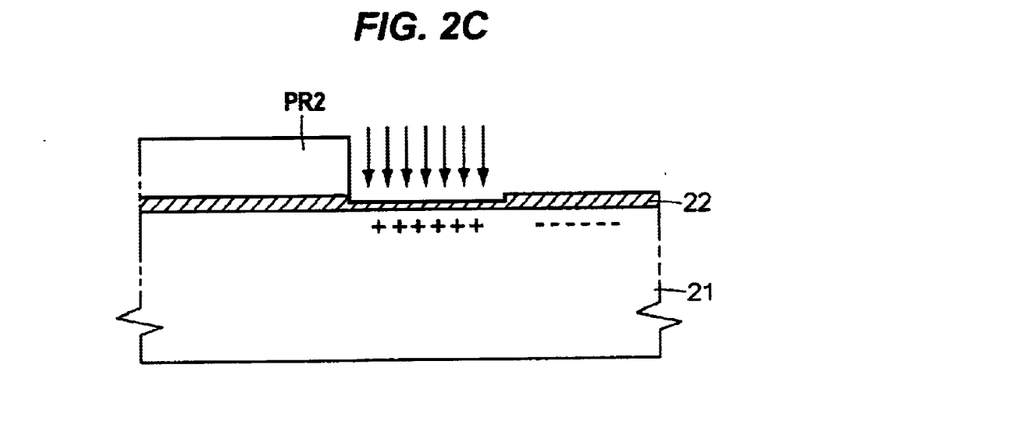
Figure 2D:
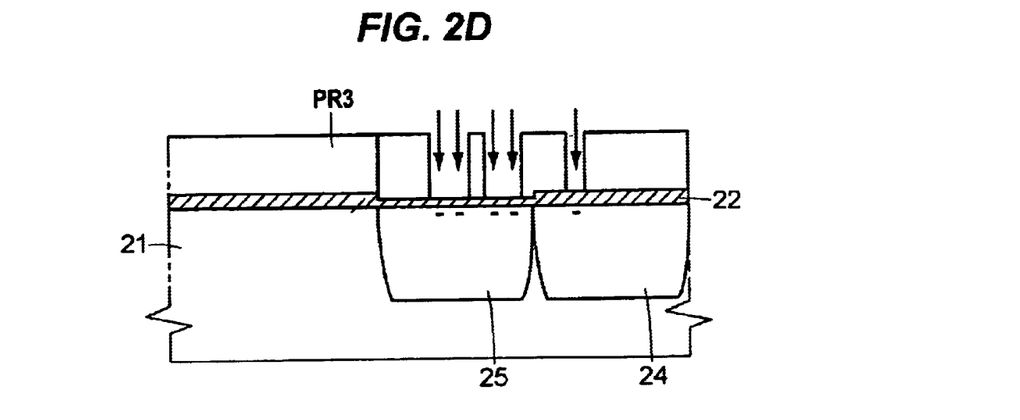
Figure 2E:
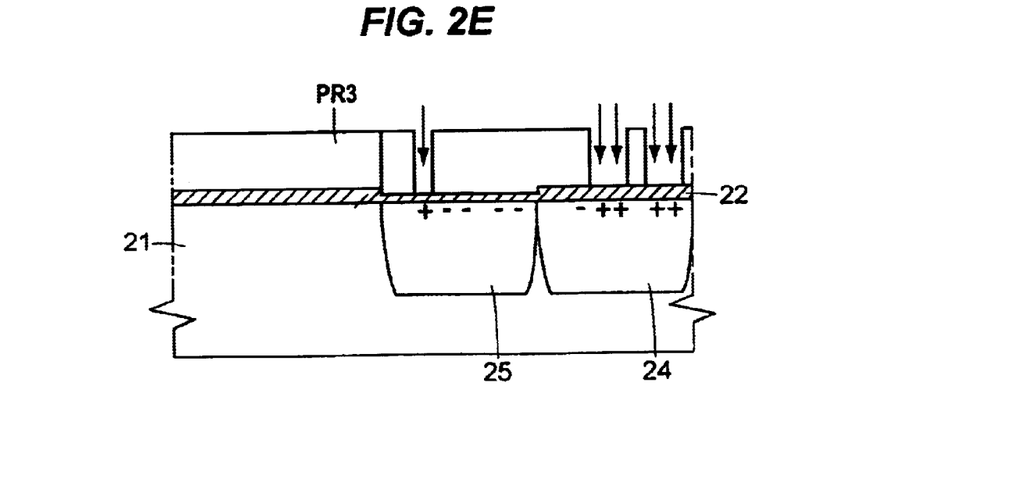
Figure 2F:
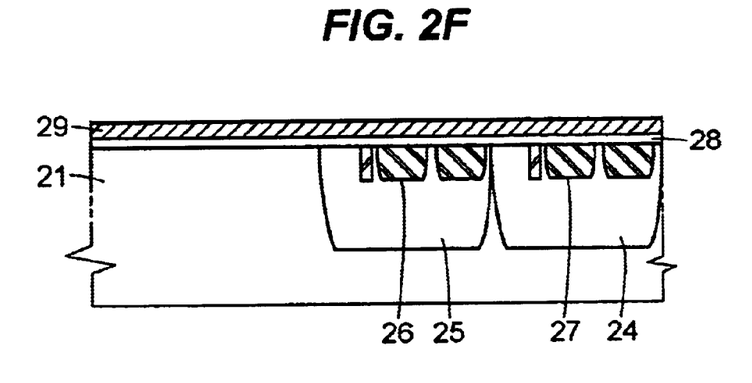
Figure 2G:
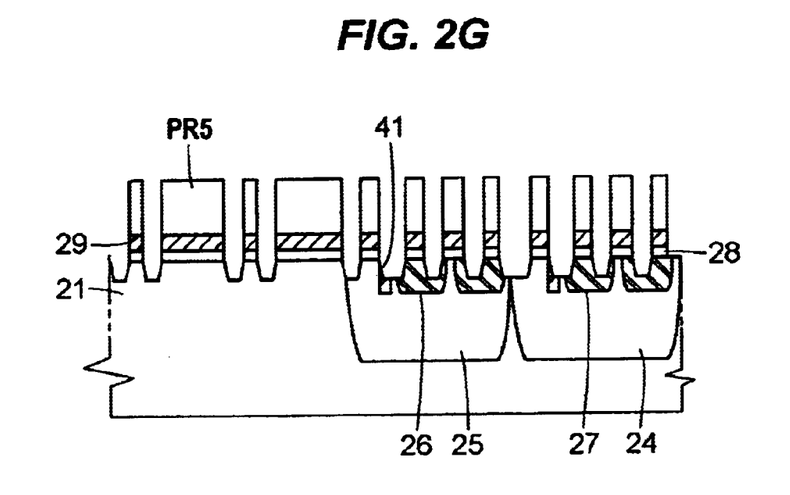
Figure 2H:
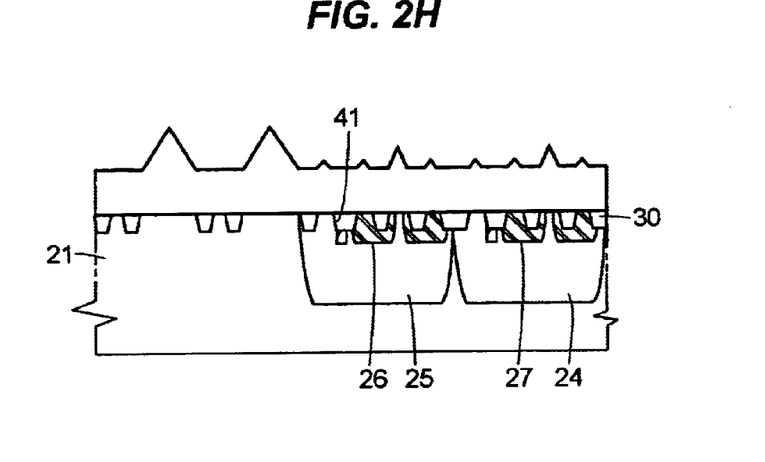
Figure 2I:
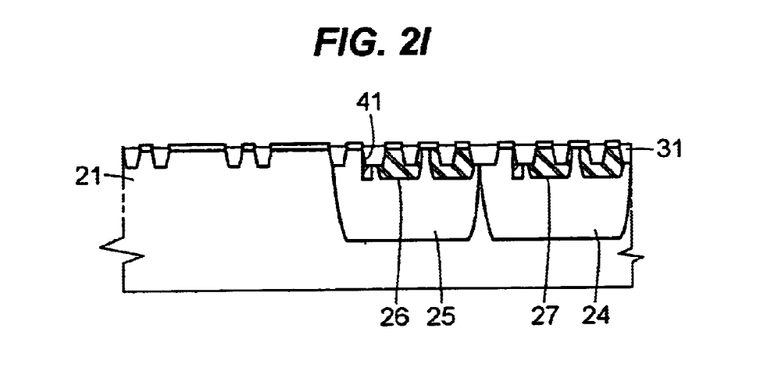
Figure 2J:
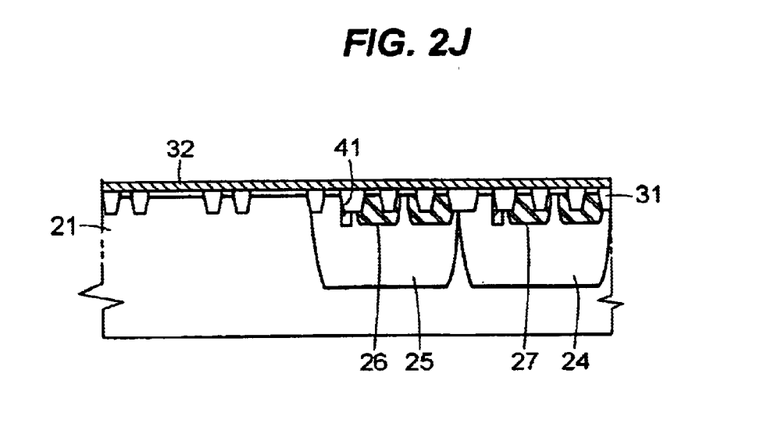
Figure 2K:
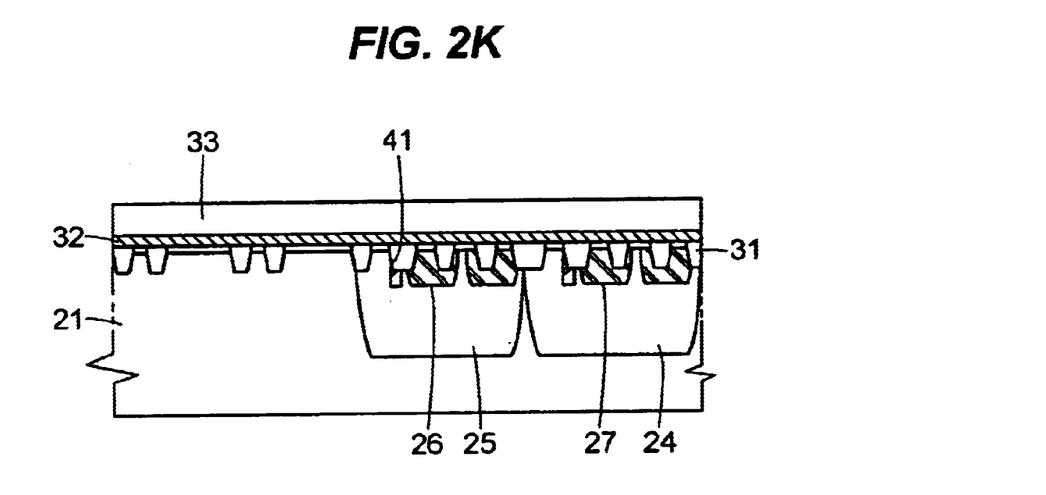
Figure 2L:
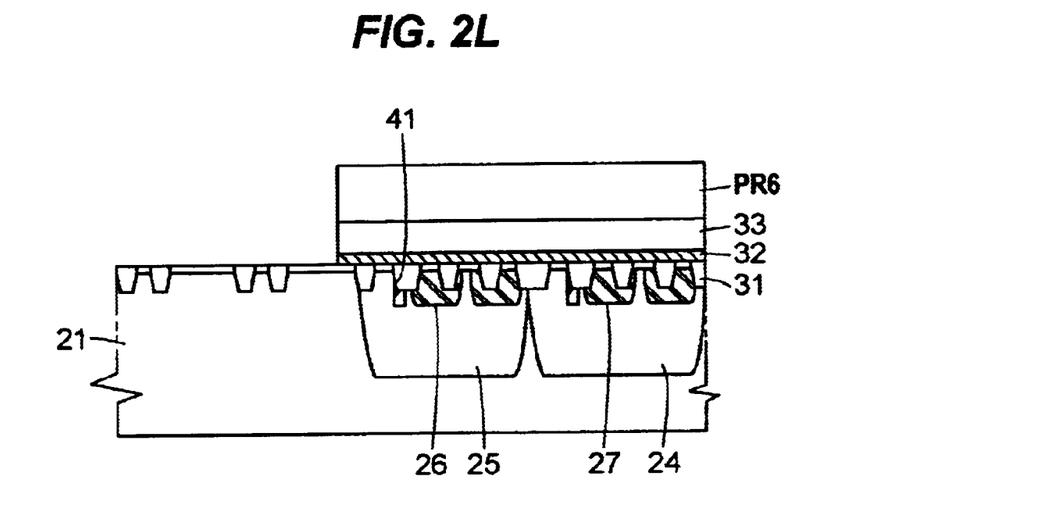
Figure 2M:
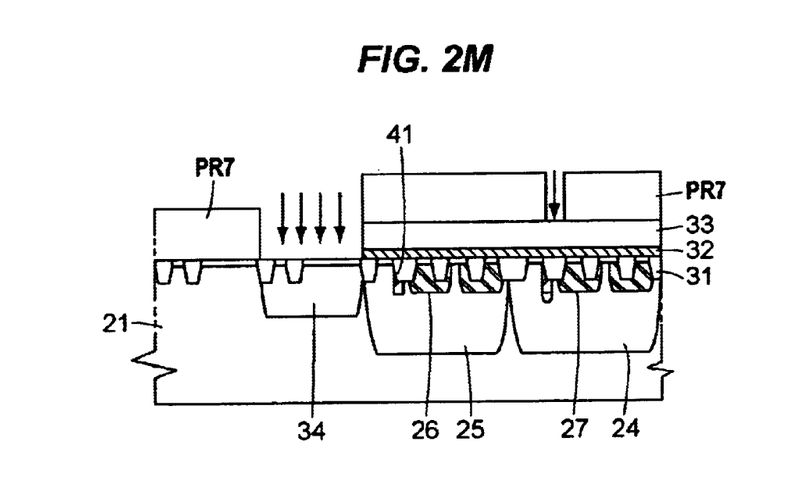
Figure 2N:
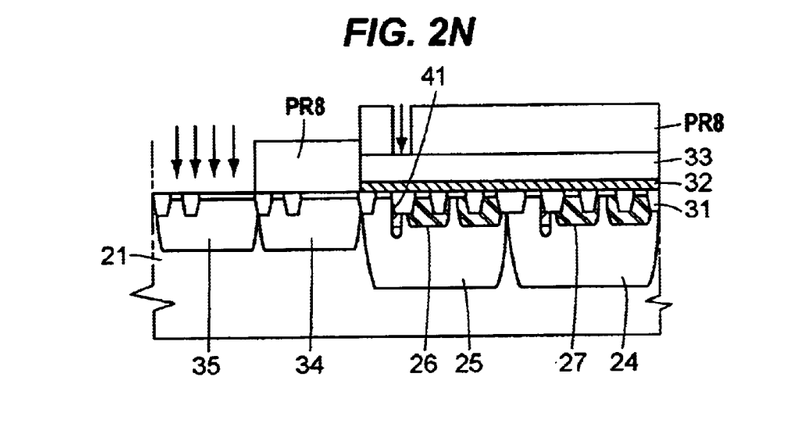
Figure 2O:
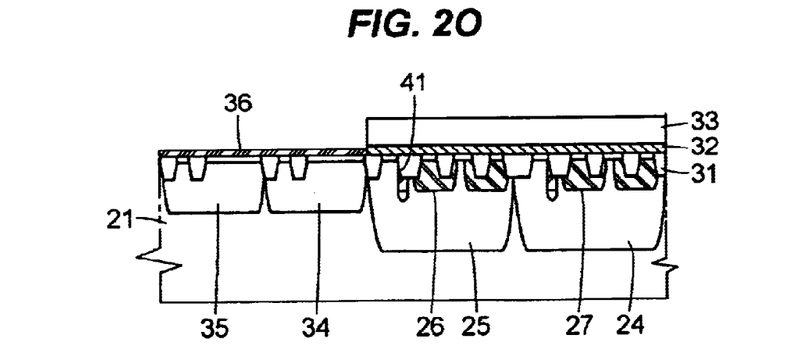
Figure 2P:
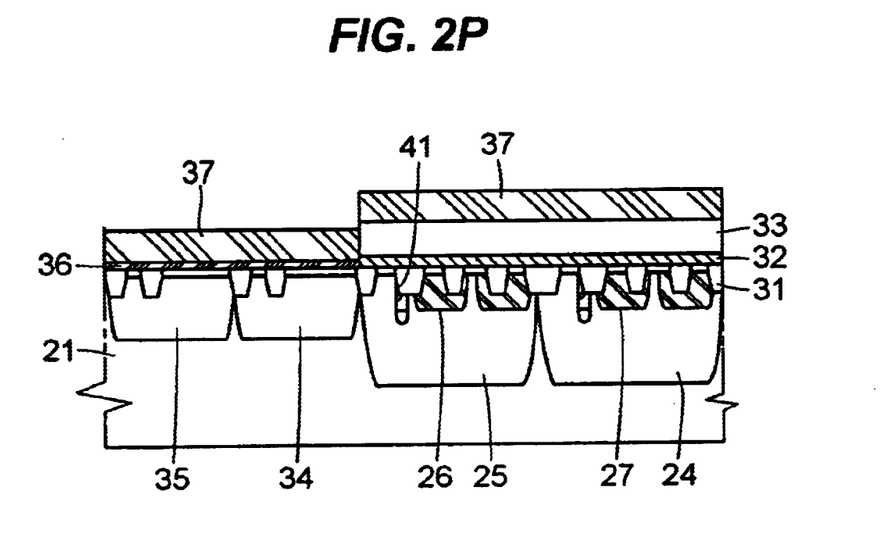

FIGS. 2a to 2p are sectional views showing disclosed processes for fabricating a high voltage dual gate device.

In brief summary, a thin nitride film is formed in order to prevent the loss of active regions during the etching of the nitride. The film is selectively etched, and then a high voltage gate oxide film is formed, thereby suppressing the field portion where the loss occurs.

First, as shown in FIG. 2a, a first buffer oxide film 22 is formed on a semiconductor substrate 21.

Then, as shown in FIG. 2b, a nitride film 23 is formed, a high voltage n-type well region is defined using a photoresist pattern PR1, and an ion implantation process is conducted as shown.

Next, as shown in FIG. 2c, a high voltage p-type well region is defined using a photoresist pattern PR2 as a mask and then an ion implantation process is conducted.

And, as shown in FIG. 2d, a high voltage n-type well region 24 and a high voltage p-type well region 25 are formed by a drive-in diffusion process. Next, as a photoresist pattern PR3 is formed, and then an ion implantation process for forming the source/drain of a high voltage NMOS transistor is conducted.

As shown in FIG. 2e, a photoresist pattern PR4 is formed and then an ion implantation process for forming the source/drain of a high voltage PMOS transistor is conducted.

Next, as shown in FIG. 2f, the ion implanted source and drain are drive-in diffused by annealing to form the source/drain region 26 of the high voltage NMOS transistor and the source/drain region 27 of the high voltage PMOS transistor. The first buffer oxide film 22 is then removed by wet etching, a second buffer oxide film 28 is formed, and a nitride layer is deposited on the grown oxide film at about 1000 Å used as a planarization stop layer 29 in a CMP process.

Next, as shown in FIG. 2g, a trench 41 for device isolation is formed using a photoresist pattern PR5 in which a STI region is opened.

Continually, as shown in FIG. 2h, a high-density plasma (HDP) oxide film 30 is deposited over the entire surface including the trench 41.

Next, as shown in FIG. 2i, the HDP oxide film 30 and the planarization stop layer 29 are removed and planarized by CMP to form a device isolation layer 31, and then the residual nitride layer 29 is removed by wet etching.

As shown in FIG. 2j, a buffer nitride 32 is deposited at a thickness of less than or about 300 Å.

Next, as shown in FIG. 2k, a high voltage gate oxide film 33 having a thickness of about 1000 Å is deposited on the entire surface of the buffer nitride 32.

As shown in FIG. 2l, a photoresist pattern PR6 is formed in which a low voltage transistor forming region is opened, and part of the buffer nitride 32 and high voltage gate oxide film 33 in the low voltage transistor forming region are removed using the photoresist pattern PR6 as a mask.

Next, as shown in FIG. 2m, an ion implantation process is conducted using a photoresist pattern PR7 as a mask to form a low voltage n-type well region 34.

As shown in FIG. 2n, an ion implantation process is conducted using a photoresist pattern PR8 as a mask to form a low voltage p-type well region 35.

Next, as shown in FIG. 2o, the mask PR8 is removed and threshold voltage (Vt) controlling ions are implanted into the low voltage transistor forming region and then a low voltage gate oxide film 36 is formed.

As shown in FIG. 2p, a device driving gate polysilicon layer 37 is deposited on the high and low gate oxide layer 33 and 36, and then selectively patterned to form the gate electrodes.

The above-described methods for fabricating high voltage dual gate devices has the following advantages.

The disclosed methods limit the loss of the device isolation layer 31 by forming a thin buffer nitride film 32 (FIG. 2j) in order to prevent the loss of active regions occurring in the etching portions of the nitride layer 32 and the oxide layer 33 on the low voltage transistor forming region (FIG. 2l).

That is, after selectively etching the nitride film 32, the high voltage gate oxide film 33 remains intact or the high voltage device forming region to suppress the loss of the device isolation layer 31, thereby improving the operational characteristics of the resulting device and increasing its reliability.

What is claimed is:

1. A method for fabricating a high voltage dual gate device comprising:

forming high voltage n-type and p-type well regions in a high voltage device forming region of a semiconductor substrate, the substrate also having a low voltage device forming region;

forming the source/drain of a high voltage NMOS transistor and the source/drain of a high voltage PMOS transistor in the well regions;

forming a trench by a STI process and forming a device isolation layer in the trench and forming a buffer nitride film on the resulting structure;

forming a high voltage gate oxide film on the buffer nitride film and etching portions of the high voltage gate oxide and buffer nitride films disposed over the low voltage device forming region leaving the said high voltage gate oxide and buffer nitride films intact on top of the high voltage device forming region; and forming low voltage p-type and n-type well regions in the low voltage device forming region and forming a low voltage gate oxide film on top of the low voltage device forming region.

2. The method of claim 1, wherein, in the etching of the high voltage gate oxide film and buffer nitride film, the device isolation layer disposed over the high voltage device forming region is effectively protected from etching by the buffer nitride film.

3. The method of claim 1, wherein the device isolation layer is formed by depositing a HDP oxide film and then planarizing the HDP oxide film by a CMP process.

4. The method of claim 1 further comprising forming a gate electrode on top of the low voltage gate oxide layer and forming a gate electrode on the high voltage gate oxide film.

5. The method of claim 4, wherein said gate electrodes are formed from device driving gate polysilicon layers.

6. The method of claim 1, wherein the high voltage n-type and p-type well regions are formed by a drive-in diffusion process.

7. The method of claim 1, wherein the source/drain of the high voltage NMOS transistor and the source/drain of the high voltage PMOS transistor are formed by an ion implantation process and are subsequently drive-in diffused by annealing.

8. The method of claim 1, wherein the forming of the trench by the STI process extends through a buffer oxide film, a planarization stop layer nitride film and a photoresist pattern.

9. The method of claim 1, wherein the buffer nitride film has a thickness of less than or about 300 Å.

10. The method of claim 1, wherein the high voltage gate oxide film has a thickness of about 1,000 Å.

11. The method of claim 2, wherein the device isolation layer is formed by depositing a HDP oxide film and then planarizing the HDP oxide film by a CMP process.

12. The method of claim 11 further comprising forming a gate electrode on top of the low voltage gate oxide layer and forming a gate electrode on the high voltage gate oxide film.

13. The method of claim 12, wherein said gate electrodes are formed from device driving gate polysilicon layers.

14. The method of claim 13, wherein the high voltage n-type and p-type well regions are formed by a drive-in diffusion process.

15. The method of claim 14, wherein the source/drain of the high voltage NMOS transistor and the source/drain of the high voltage PMOS transistor are formed by an ion implantation process and are subsequently drive-in diffused by annealing.

16. The method of claim 15, wherein the forming of the trench by the STI process extends through a buffer oxide film, a planarization stop layer nitride film and a photoresist pattern.

17. The method of claim 16, wherein the buffer nitride film has a thickness of less than or about 300 Å.

18. The method of claim 17, wherein the high voltage gate oxide film has a thickness of about 1,000 Å.

19. A method for fabricating a high voltage dual gate device comprising:

providing a semiconductor substrate having a high voltage device forming region and a low voltage device forming region;

forming a trench in the high voltage device forming region;

forming a device isolation layer in the trench;

forming a buffer nitride film on the device isolation layer;

forming a high voltage gate oxide film and buffer nitride film on the resultant structure and etching portions of the high voltage gate oxide and buffer nitride films disposed on top of the low voltage device forming region of the semiconductor substrate thereby leaving the high voltage gate oxide film and buffer nitride films intact on top of the high voltage device forming region; and forming low voltage p-type and n-type well regions in the low voltage device forming region and forming a low voltage gate oxide film on top of the low voltage device forming region.

20. The method of claim 19, wherein the device isolation layer is formed by depositing an HDT oxide film and then planarizing said HDT oxide film by a CMP process.

* * * * *